Figure 3:
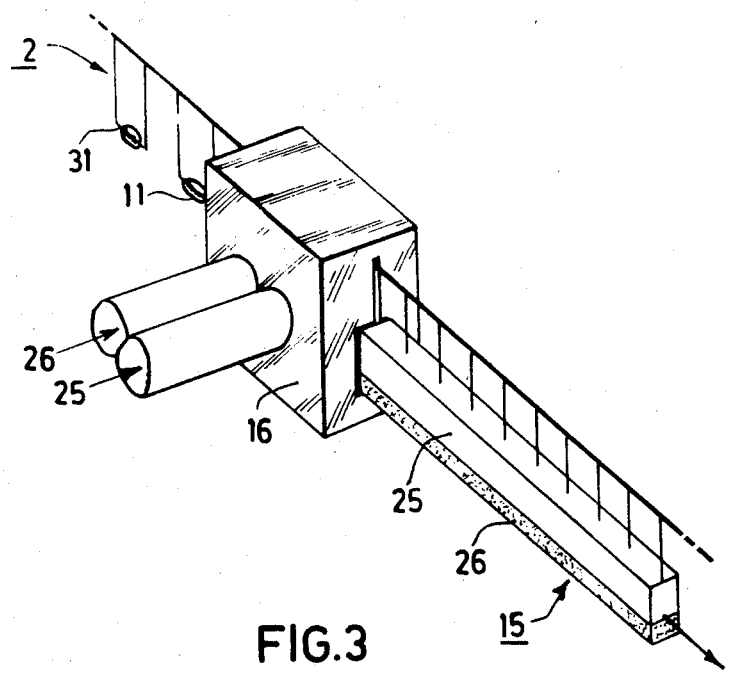

United States Patent [19]

Sahakian

[11] Patent Number: 4,540,533
[45] Date of Patent: Sep. 10, 1985

[54] METHOD OF ENCAPSULATING ELECTRONIC COMPONENTS BY EXTRUSION OF PLASTIC MATERIAL

[75] Inventor: Diran-Robert Sahakian, Noisy-le-Sec, France

[73] Assignee: U.S. Philips Corporation, New York, N.Y.

[21] Appl. No.: 545,551

[22] Filed: Oct. 26, 1983

[30] Foreign Application Priority Data

Oct. 29, 1982 [FR] France ................................ 82 18253
Jun. 27, 1983 [FR] France ................................ 83 10571

[51] Int. Cl.$^3$ ............................................. B29F 3/10
[52] U.S. Cl. ..................................... 264/1.4; 264/1.9; 264/22; 264/149; 264/174; 264/272.13; 264/272.14; 264/272.15; 264/272.16; 264/272.17; 264/272.18
[58] Field of Search ................. 264/22, 272.13, 272.14, 264/272.15, 272.16, 174, 149, 172, 1.9, 1.2–1.6, 272.17, 272.18

[56] References Cited

U.S. PATENT DOCUMENTS

| | | | |
|---|---|---|---|
| 2,513,421 | 7/1950 | Meoni | 264/157 |
| 2,963,747 | 12/1960 | Brown | 264/22 |
| 3,499,816 | 3/1970 | Areskoug | 425/511 |
| 3,845,552 | 11/1974 | Waltz | 29/628 |
| 4,042,654 | 8/1977 | Leszyk et al. | 264/22 |
| 4,045,867 | 9/1977 | Ström | 264/157 |
| 4,073,835 | 2/1978 | Otsuki et al. | 264/22 |
| 4,148,856 | 4/1979 | Gress et al. | 264/272.18 |
| 4,264,549 | 4/1981 | Utner | 264/272.15 |
| 4,294,782 | 10/1981 | Froehlig | 264/22 |
| 4,321,425 | 3/1982 | Emmel | 264/272.15 |
| 4,330,929 | 5/1982 | Cripe | 264/22 |

FOREIGN PATENT DOCUMENTS

| | | | |
|---|---|---|---|
| 56-117625 | 9/1981 | Japan | 264/172 |
| 960097 | 6/1964 | United Kingdom | 264/272.14 |

Primary Examiner—Jeffery Thurlow
Attorney, Agent, or Firm—Norman N. Spain

[57] ABSTRACT

Encapsulation of electronic components.

Method of encapsulating bare electronic components (11) present in the form of a continuous strip (12) and intended to be provided with envelopes (13, 14) of a defined form made of at least one plastic material (15), characterized in that by extrusion by means of an extrusion head (16) the plastic material (15) is given the profile desired for the said envelopes (13, 14), while the bare electronic components are continuously inserted and immobilized in the said profile, and in that in a final operation common sections of extruded plastic material (15) and of a strip (12) of components are cut so that the bare electronic components (11) thus provided with their envelopes (13, 14) are mutually separated.

Application in the manufacture of display elements.

20 Claims, 10 Drawing Figures

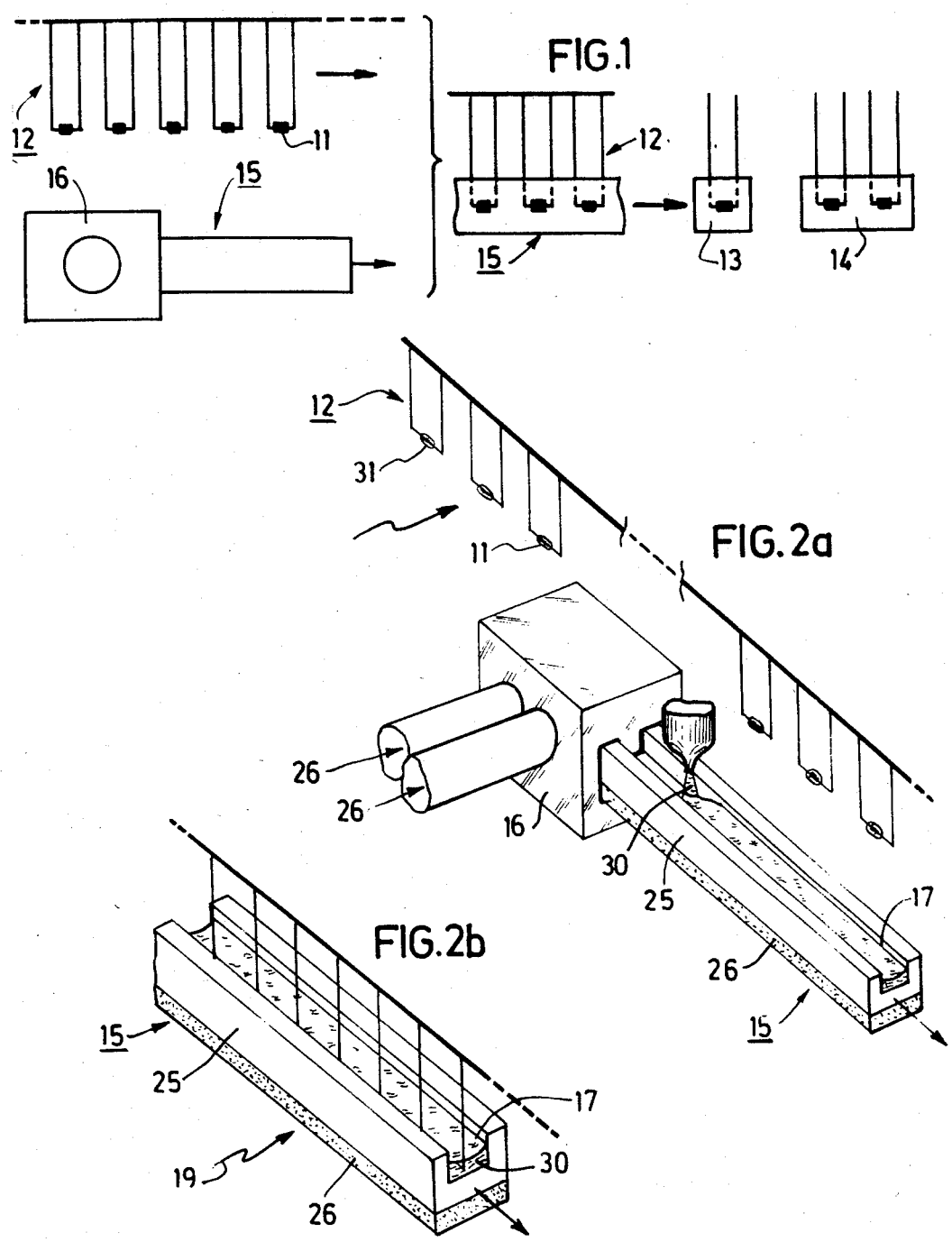

METHOD OF ENCAPSULATING ELECTRONIC COMPONENTS BY EXTRUSION OF PLASTIC MATERIAL

The invention relates to a method of encapsulating bare electronic components present in the form of a continuous strip in which the said components are aligned in a first direction, the bare electronic components being intended to be provided with envelopes having a defined profile obtained by extrusion, parallel to the said first direction, of at least one plastic material by means of an extrusion head.

The invention can be used particularly advantageously in the general field of encapsulation of bare electronics components and especially the encapsulation of light-emitting diodes in order to obtain display elements.

A known method of manufacturing display elements consists in that individual cups are used, whose interior part reproduces the exterior form of the display elements and which serves as a mould for the plastic material. Each cup is filled manually with a drop of diffusing resin and then with a drop of transparent resin. After having been cured in a polymerizable resin, the light-emitting diodes, which constitute the active part of the display elements, are arranged in the interior of the cups in the transparent resin. The resins are then polymerized and the display elements thus obtained are taken out of the cups. This known method has a few disadvantages, however. In fact, the operations of filling the cups make the cost price of the display elements comparatively high. Furthermore the cups can be used only a limited number of times and have to be replaced then.

The invention has for its object to obviate these disadvantages starting from the idea that this kind of manufacture could be fully mechanized by a mass production.

The encapsulating method according to the invention is characterized in that it is carried out for components with rigid connection wires extending in a second direction substantially at right angles to the first direction in which the components are aligned, in that the bare electronic components are inserted and immobilized continuously in the said profile so that the encapsulation is limited to the components excluding the connection wires, and in that in a final operation common sections of extruded plastic material and of the continuous strip in which the components are aligned are cut so that the bare electronic components provided with their envelopes are mutually separated.

The method according to the invention consequently permits of obtaining the encapsulation of the components in a quasi automatic manner and in a very large series, which leads to a very substantial reduction of the production cost. Another advantage of the invention is that not only individual encapsulated components, but also rods of an arbitrary number of components are obtained.

In a first embodiment of the invention, the profile of the plastic material leaving the extrusion head comprising a groove, at the outlet of the extrusion head the said groove is filled continuously with a polymerizable filler resin, after which the bare electronic components are inserted into the groove, whereupon the said polymerizable filler resin is polymerized so that the components are immobilized in the groove.

This particular embodiment is especially very advantageous in the case of encapsulation of light-emitting diodes for the manufacture of display elements.

In order to avoid the formation of air bubbles and the appearance of mechanical tension, it is ensured that, before being inserted into the groove, the bare electronic components are cured in a polymerizable curing resin and that the said polymerizable curing resin is polymerized.

In a second embodiment of the invention, the bare electronic components are inserted continuously into the profile of plastic material by directly introducing the said strip of components into the extrusion head, the immobilization of the said components being obtained by enveloping them in the plastic material itself. This embodiment is particularly interesting because it considerably simplifies the operation of immobilizing the components. It also offers the advantage that it permits giving the envelope a desired form, for example a round form in the case of given display elements. Therefore, it is ensured that at the outlet of the extrusion head the plastic material, which is then in the plasto-elastic state is caused to pass into a tool provided with two rotatable coplanar heads which give the plastic material the ultimate desired form of the envelopes. As the case may be, the said tool may further comprise a third forming head at right angles to the two rotatable coplanar heads.

Due to the possibility of simultaneously extruding several plastic materials, the method according to the invention can be used particularly advantageously in the manufacture of display elements. In this case, in fact, the bare electronic components being light-emitting diodes, the said envelopes are obtained by simultaneously extruding a first transparent plastic material and a second plastic material comprising diffusing pigments.

Finally, another application of the invention relates to the encapsulation of bare electronic circuits; it consists in that the said electronic circuits are pre-enveloped by polymerization of a protecting resin.

Another application of the invention is particularly characterized in that, the bare electronic components being light-emitting diodes, the said envelopes are obtained by simultaneously extruding a first transparent plastic material and a second opaque plastic material disposed laterally on either side of the said first transparent plastic material.

Thus the envelopes obtained in this manner have two opaque surfaces permitting of reflecting and canalizing a part of the light emitted by the light-emitting diodes to the front of the display elements, thus in the useful direction.

Further, it can be ensured that a third plastic material comprising diffusing pigments is extruded simultaneously with the said first and the said second plastic material so as to constitute the end of the envelopes.

Finally, it is ensured that the second opaque plastic material is a transparent plastic material doped with titanium oxide.

Figure 5:
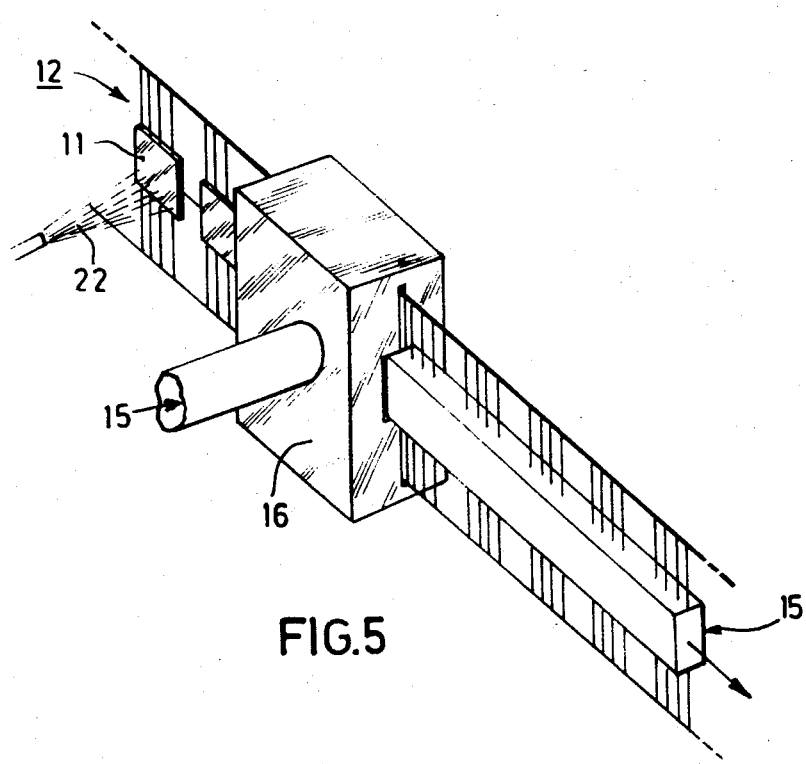
Figure 4:
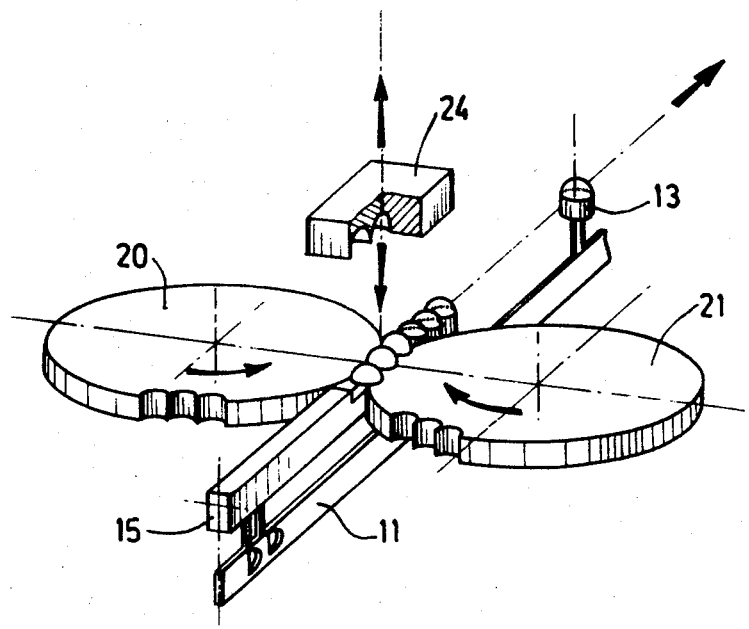
Figure 6:
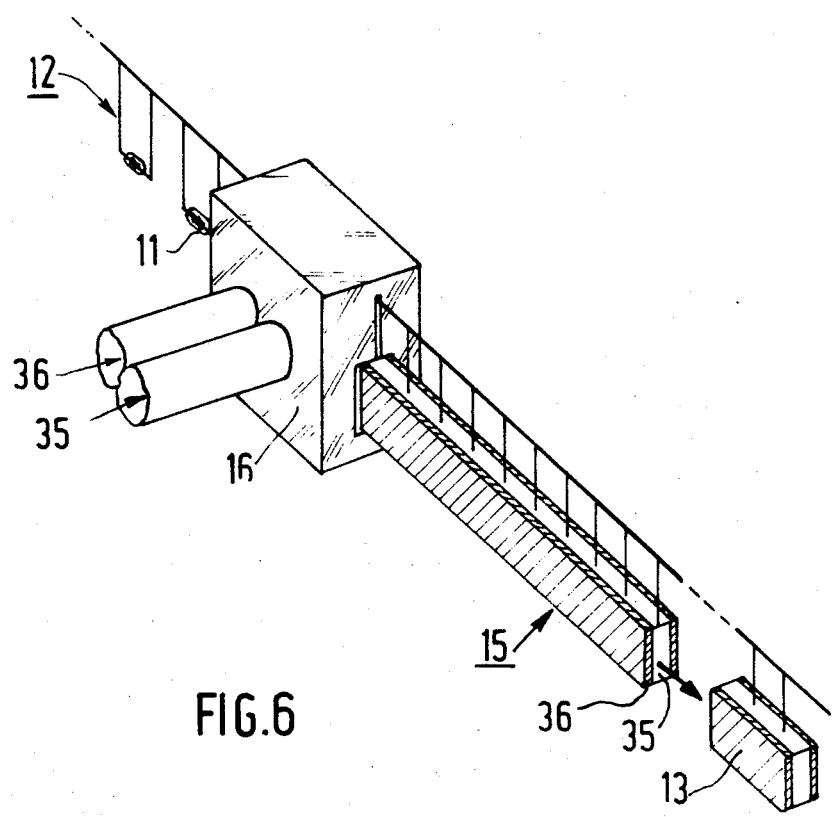
Figure 7:
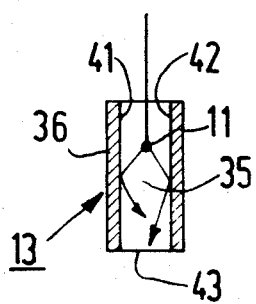
Figure 8:
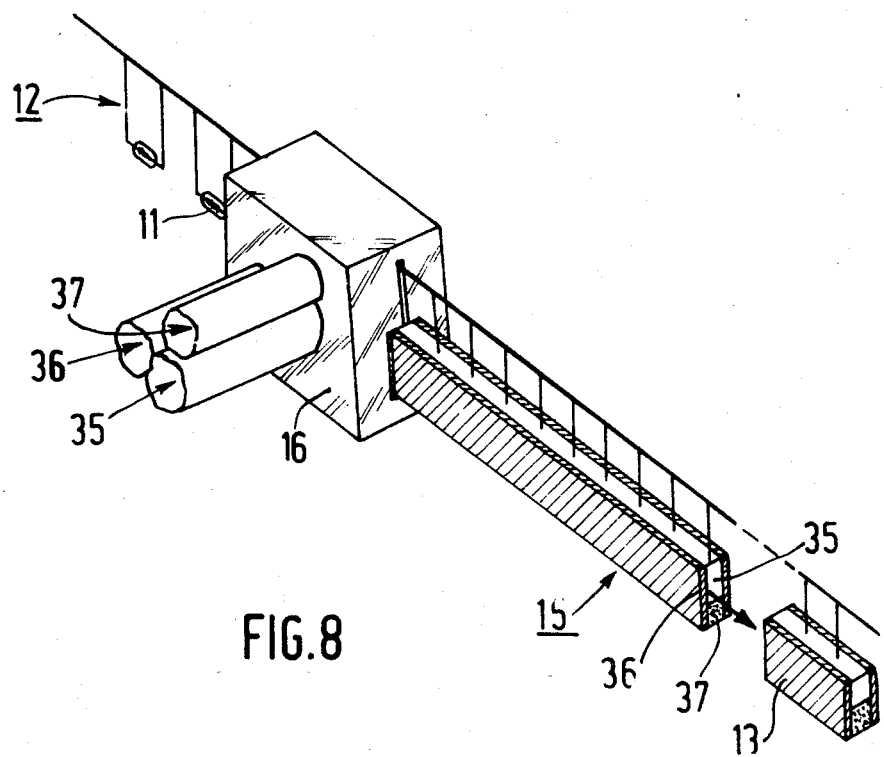
Figure 9:
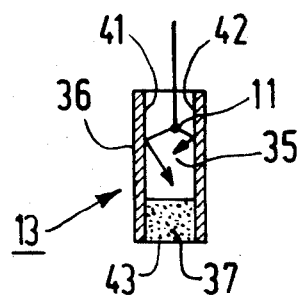

In order that the invention may be readily carried out, it will now be described more fully, by way of example, with reference to the accompanying drawings, in which:

FIG. 1 is a diagrammatic representation of the method according to the invention, FIG. 2 is a perspective view of a first embodiment of the invention, FIG. 3 is a perspective view of a second embodiment of the invention, FIG. 4 is a plan view of an operation for forming the envelopes obtained by the method according to the invention, FIG. 5 is a perspective view of an application of the method according to the invention in electronic circuits, FIG. 6 is a perspective view of a third embodiment of the invention, FIG. 7 is a sectional view of a display element obtained by means of the embodiment shown in FIG. 6, FIG. 8 is a perspective view of another embodiment, FIG. 9 is a sectional view of a display element obtained by means of the embodiment shown in FIG. 8.

FIG. 1 shows diagrammatically the different stages of a method of encapsulating bare electronic components 11 which, in the embodiment of FIG. 1, are light-emitting diodes. These components 11 are shown in the form of a continuous strip 12 and are intended to be provided with envelopes 13, 14 of a defined form made of at least one plastic material 15. According to FIG. 1, the plastic material 15 is given, the desired profile for the said envelopes 13, 14 by extrusion by extrusion head 16. The bare electronic components 11 are then inserted and immobilized in the said profile, after which in a final operation common sections of extruded plastic material 15 and of a strip 12 of components are cut so that the bare electronic components 11 thus provided with their envelopes 13, 14 are mutually separated.

In the first embodiment of the invention shown in FIG. 2, the profile of the plastic material 15 leaving the extrusion head 16 comprises a groove 17. At the outlet of the extrusion head this groove is filled continuously with a polymerizable filler resin 30. Subsequently, the bare electronic components 11 are inserted into the groove 17, after which the polymerizable resin 30 is polymerized so that the components are immobilized in the groove.

As shown in FIG. 2b, the polymerizable filler resin 30 is a resin which is photopolymerizable under the influence of an ultraviolet radiation 19.

In the embodiment of FIG. 2a, before being inserted into the groove 17, the bare electronic components 11 are cured in a polymerizable curing resin 31, which may be identical to the filler resin 30. This curing resin may also be photopolymerizable.

FIG. 3 shows a second embodiment of the invention, in which the bare electronic components 11 are continuously inserted into the profile of plastic material by directly introducing the said strip 12 of components into the extrusion head, the immobilization of the said components 11 being effected by enveloping them in the plastic material itself. In this embodiment, before being introduced into the extrusion head 16, the bare electronic components 11 may also be cured in a polymerizable curing resin 31 (which may be photopolymerizable), which is then polymerized.

An advantage of the embodiment of the invention shown in FIG. 3 is that it permits each desired form of the envelopes of the components 11. As shown in FIG. 4 for an example of round envelopes 13, the plastic material 15 is extruded according to a rounded profile, after which the plastic material 15, which is then in the plasto-elastic state, is caused to pass into a tool provided with two rotatable heads 20, 21, which give the plastic material the ultimate cylindrical form desired for the envelopes 13. In order to obtain the rounded cap of the envelopes, the tool 23 further comprises a third forming head 24 at right angles to the two rotatable coplanar heads 20, 21.

The method described in FIGS. 1, 2, 3 and 4 is used particularly for encapsulating light-emitting diodes in order to manufacture display elements with the advantage that the envelopes of the display elements can be obtained by simultaneously extruding a first transparent plastic material 25 and a second plastic material 26 comprising diffusing pigments.

More generally, the method of encapsulation according to the invention has a variety of applications depending upon the bare electronic components to be encapsulated. In the case of bare integrated circuits, it can be ensured, as shown in FIG. 5, that the said integrated circuits 11 are pre-enveloped by polymierization of a protecting resin 22.

Besides active electronic components (power diodes, photocouplers etc.), the method according to the invention also may be applied to passive components such as resistors or capacitors).

FIG. 6 is a perspective view of an application in the manufacture of display elements of a method of encapsulating bare electronic components 11 present in the form of a continuous strip 12 and intended to be provided with envelopes 13 of a defined form made of at least one plastic material 15. As can be seen in FIG. 6, the bare electronic components 11 are light-emitting diodes and the envelopes 13 are obtained by simultaneously extruding a first transparent plastic material 35 and a second opaque plastic material 36 disposed laterally on either side of the said transparent plastic material. As illustrated in the sectional view of FIG. 7, the light rays emitted by the light-emitting diode 11 and reaching the surfaces 41 and 42 covered by the opaque plastic material 36 are reflected towards the output surface 43 of the display element, whose efficiency is thus increased.

Advantageously, the said opaque plastic material 36 is a transparent plastic material, as the case may be identical to the transparent plastic material 35, but doped with titanium oxide.

FIG. 8 shows another embodiment, in which a third plastic material 37 comprising diffusing pigments is extruded simultaneously with the said first plastic material 35 and the second plastic material 36 so as to constitute the end of the envelopes 13.

FIG. 9 shows that the light rays which are reflected by the opaque plastic material 36 are directed towards the output surface 43 of the display elements after having traversed the diffusing plastic material 37.

What is claimed is:

1. A method of encapsulating bare electronic components present in the form of a continuous strip in which the said components are aligned in a first direction, the bare electronic components being intended to be provided with envelopes of a defined profile obtained by extrusion, in a direction parallel to the said first direction, of at least one plastic material by means of an extrusion head, characterized in that the method of encapsulation is carried out for components with rigid connection wires extending in a second direction substantially at right angles to the first direction in which the components are aligned, in that the bare electronic components (11) are continuously inserted and immobilized in the envelopes of said profile so that the encapsulation is limited to the components (11) excluding the rigid connection wires, and in that in a final operation common sections of plastic material (15) extruded from said extrusion head, in which the aligned components are inserted and immobilized and of the continous strip (12), are cut so that the bare electronic components (11) provided with their envelopes (13, 14) are mutually separated.

2. A method of encapsulation as claimed in claim 1, characterized in that, the plastic material (15) leaving the extrusion head (16) is given a profile comprising a groove (17), in that at the outlet of the extrusion head the said groove is filled continuously with a polymerizable filler resin (30), and in that then the bare electronic components (11) are inserted into the groove (17), after which the said polymerizable filler resin (30) is polymerized so as to immobilize the components in the groove.

3. A method of encapsulation as claimed in claim 2, characterized in that, before being inserted into the groove (17), the bare electronic components (11) are cured in a polymerizable curing resin, and in that the said polymerizable curing resin (31) is polymerized.

4. A method of encapsulation as claimed in of claim 2, characterized in that the said polymerizable filler resin (30) is a photopolymerizable resin.

5. A method of encapsulation as claimed in claim 1, characterized in that the bare electronic components (11) are continuously inserted into the profile of the plastic material (15) by directly introducing the said strip (12) of components into the extrusion head (16), the immobilization of the said components (11) being obtained by enveloping them in the plastic material itself.

6. A method of encapsulation as claimed in claim 5, characterized in that, before being introduced into the extrusion head (16), the bare electronic components (11) are cured in a polymerizable curing resin, after which the said polymerizable curing resin (31) is polymerized.

7. A method of encapsulation as claimed in claim 3, characterized in that the said polymerizable curing resin (31) is a photopolymerizable resin.

8. A method of encapsulation as claimed in claim 6, characterized in that at the outlet of the extrusion head (16) the plastic material (15), which is then in the plasto-elastic state, is caused to pass into a tool (23) provided with two rotatable coplanar heads (20, 21) which give the plastic material the ultimate desired form of the envelope (13).

9. A method of encapsulation as claimed in claim 8, characterized in that the said tool (23) further comprises a third forming head (24) at right angles to the two rotatable coplanar heads (20, 21).

10. A method of encapsulation as claimed in claim 1, characterized in that, for manufacturing display elements light-emitting diodes are used as bare electronic components (11), the said envelopes (13, 14) are obtained by simultaneously extruding a first transparent plastic material (25) and a second plastic material (26) comprising diffusing pigments.

11. A method of encapsulation as claimed in claim 5, characterized in that, for encapsulating bare electronic circuits (11), the said electronic circuits are pre-enveloped by polymerization of a protecting resin (22).

12. A method of encapsulation as claimed in claim 1, characterized in that, the bare electronic components (11) being light-emitting diodes, the said envelopes (13) are obtained by simultaneously extruding a first transparent plastic material (35) and a second opaque plastic material (36) disposed laterally on either side of the said first transparent plastic material.

13. A method as claimed in claim 12, characterized in that a third plastic material (37) comprising diffusing pigments is extruded simultaneously with the said first plastic material (35) and the said second plastic material (36) so as to constitute the bottom end of the envelopes (13).

14. A method as claimed in claim 12, characterized in that the second opaque plastic material (36) is a transparent plastic material doped with titanium oxide.

15. A method of encapsulation as claimed in claim 3, characterized in that the said polymerizable filler resin (30) is a photopolymerizable resin.

16. A method of encapsulation as claimed in claim 4, characterized in that the said polymerizable curing resin (31) is a photopolymerizable resin.

17. A method of encapsulation as claimed in claim 7, characterized in that the outlet of the extrusion head (16), the plastic material (15), which is then in the plasto-elastic state, is caused to pass into a tool (23) provided with two rotatable coplanar heads (20, 21) which give the plastic material the ultimate desired form of the envelopes (13).

18. A method of encapsulation as claimed in claim 2, characterized in that for manufacturing display elements light-emitting diodes are used as bare electronic element components (11), the said envelopes (13, 14) are obtained by simultaneously extruding a first transparent plastic material (25) and a second plastic material (26) comprising diffusing pigments.

19. A method of encapsulation as claimed in claim 6, characterized in that for encapsulating bare electronic circuits (11), said electronic circuits are pre-enveloped by polymerization of a protecting resin (22).

20. A method of encapsulation as claimed in claim 13, characterized in that the second opaque plastic material (36) is a transparent plastic material doped with titanium oxide.

* * * * *